United States Patent [19]

Hartjes et al.

[11] Patent Number: 4,715,133
[45] Date of Patent: Dec. 29, 1987

[54] GOLF SHOE

[76] Inventors: Rudolf Hartjes, Neuhofen 12, A-4910 Ried/Innkreis, Austria; Günter Gräber, Klosterstrasse 4, D-6732 Edenkoben, Fed. Rep. of Germany

[21] Appl. No.: 874,229

[22] Filed: Jun. 13, 1986

[30] Foreign Application Priority Data

Jun. 18, 1985 [AT] Austria .................... 1803/85

[51] Int. Cl.[4] .................... A43B 5/00; A43C 15/00
[52] U.S. Cl. .................... 36/127; 36/61; 36/134
[58] Field of Search .................... 36/127, 134, 61, 59 R, 36/67 R, 67 A, 67 B

[56] References Cited

U.S. PATENT DOCUMENTS

| 241,733 | 5/1881 | Shaw | 36/59 R |
| 303,287 | 8/1884 | Hunn | 36/59 R |
| 429,429 | 6/1890 | Eckhardt | 36/59 R |
| 3,082,549 | 3/1963 | Dolceamore | 36/134 |
| 4,271,608 | 6/1981 | Tomuro | 36/127 X |

FOREIGN PATENT DOCUMENTS

| 930798 | 7/1955 | Fed. Rep. of Germany. |
| 2262528 | 6/1974 | Fed. Rep. of Germany .......... 36/61 |
| 3014254 | 10/1981 | Fed. Rep. of Germany. |
| 3046811 | 7/1982 | Fed. Rep. of Germany. |

Primary Examiner—James Kee Chi
Attorney, Agent, or Firm—Kurt Kelman

[57] ABSTRACT

A golf shoe is proposed which has a sole that is provided with spikes. To permit the golf shoe to perform effectively as a walking shoe and as a striking shoe, each spike is inserted in and axially movable relative to the sole and on top of the sole comprises a pressure-applying plate which bears on the top of a resilient abutment.

5 Claims, 2 Drawing Figures

GOLF SHOE

BACKGROUND OF THE INVENTION

Field of the Invention

This invention relates to a golf shoe having a sole which is provided with spikes which consist each of a shank and a pressure-applying plate and are axially movably mounted in a resilient abutment.

Description of the Prior Art

In the playing of golf, the striking of the ball and the walking over distances sometimes amounting to a mile or more require the golfer to perform two kinds of motion, which are highly different. For this reason a good golf shoe must permit the golfer to stand firmly for the striking action and must provide a convenient support for the foot of the walking player. In order to improve the stand of the golfer it is known to provide the sole of the shoe with various nails or spikes. To ensure that the spikes can be kept clean and that the action of the spikes can be controlled in dependence on the nature of the ground, it has been proposed in U.S. Pat. No. 4,271,608 and in German Pat. No. 930,798 to embed the spikes in a resilient abutment. But in said known shoes the pressure-applying plate of each spike is secured to the underside of the sole and the abutment layer is also attached to the underside of the sole so that the spikes and the sole cannot move relative to each other and the load is distributed by the relatively stiff sole throughout the area thereof so that it is not possible to control the action of individual spikes as may be required. For this reason it is not possible to control the extending and retracting motion of the spikes out of and into the abutment in response, to the peculiar turning and rolling movement performed by the foot when the golfer is about to strike the ball, and the walking motion is also adversely affected by the fact that the spikes are directly connected to the sole so that the golfer will suffer from fatigue particularly during a prolonged walk. Besides, the abutment layer provided on the underside of the sole will contact the ground and will be subjected to other external influences and may easily be damaged. Such damage can hardly be prevented by the provision of a protective outer layer, which would also stiffen the sole.

Similar conditions regarding the action of the spikes will be obtained if, in accordance with Published German Application No. 30 46 811, the spikes are firmly screwed into the sole and are provided with a resiliently supported plug, which is formed with a screw hole. Owing to the provision of that plug, walking is even less convenient.

It is known from Published German Application No. 30 14 254 to provide shoes having a heel, which is formed with bores, in which spike nails are guided, which are supported by means of compression springs and are adapted to be actuated by means of pressure-applying ribs and to be locked by means of a sheet metal slide. But such an arrangement is expensive and occupies a large space and is hardly reliable in use. Such an arrangement cannot be used at all in sports shoes, particularly in golf shoes.

SUMMARY OF THE INVENTION

It is an object of the invention to eliminate these disadvantages and to provide a golf shoe which is of the kind described first hereinbefore and ensures that the golfer will have the firm stand required for a reliable, precise strike and will be able to walk conveniently without fatigue.

That object is accomplished in accordance with the invention by positioning the abutment on top of the sole, the pressure-applying plate of each spike bearing on the abutment from above and the shank of each spike extending through an associated through hole formed in the sole. The shank of each spike preferably has a length which is at least as large as the total of the thickness of the adjacent portion of the abutment when it is in a relaxed state and of the thickness of the adjacent portion of the sole.

The spikes of such a golf shoe can be extended and retracted relative to the sole in dependence on the use of the shoe. When the golfer is walking, the load on the sole is distributed over a large area of the sole so that the abutment will not be substantially compressed by the forces applied thereto and the abutment can then hold all spikes in a retracted position. During walking the golf shoe thus constitutes a walking shoe having a tread which is suitable for walking and in dependence on the length of the spikes the latter do not protrude or protrude only slighlty below the sole. The resilient abutment takes up the load and provides for the foot a gentle support, which facilitates walking. On the other hand, when the player is about to strike the ball, the foot will perform a specific turning and rolling motion so that higher loads are applied to the sole adjacent to the ball and outer edge of the foot. Because these loads are not distributed over a larger area by an interposed sole, the locally concentrated load at certain regions of the foot will exceed the load-carrying capacity of the abutment and the latter will be more or less compressed so that the spikes will be extended correspondingly. As a result, the golf shoe now constitutes a striking shoe having a spiked sole and the spikes protrude from the tread mainly in the regions which are under the highest loads and in a length which depends on the load. This action will not only ensure an excellent slippproof stand of the golfer on the ground but will also permit the sole to perform a movement which facilitates the turning and rolling of the foot during the striking motion of the golfer whereas a canting of the foot will be avoided. The spikes will act only in case of need, when a concentrated load actually requires a stronger hold on the ground. As a result, the sole of the golf shoe in accordance with the invention constitutes during walking a spikeless walking sole for convenient walking without fatigue and when the golfer is about to make a stroke or is performing other extreme motions, such as jumping and sprinting motions, the sole of the golf shoe will constitute a spiked sole, which will permit a reliable striking action. The resilient abutment can easily be integrated in a suitable footbed and is safely protected by the underlying sole and permits the provision of a desired outsole of high strength.

The abutment may consist of soft plastic foam, such as soft PUR foam or soft PVC foam, or of an air-filled or liquid-filled cushion, and may desirably constitute a sole insert because such sole insert can be integrated in the sole with a low expenditure and may contribute to the provision of a convenient footbed.

Within the scope of the invention the sole itself may comprise an abutment layer so that the sole and the abutment may be made in one piece, e.g., of foamed plastic having layers differing in density.

If the pressure-applying plate of each spike has a top surface conforming to the overlying portion of the footbed or the insole, an occurrence of pressure points will be reliably avoided even in case of a prolonged application of high loads and a high wear comfort will be achieved.

Each pressure-applying plate suitably comprises a receptacle for a detachable spike shank so that spikes differing in length can be used at different times and the length in which the spikes can be projected can be selected in dependence on the weight of the golfer. It will be understood that different spikes may be selected in consideration of the condition of the ground on which the shoe is to be used.

A firm hold on the ground will be obtained if the shank of each spike is curved like a claw. Such curved shanks will be particularly effective because the spikes can be extended.

DETAILED DESCRIPTION OF THE PREFERRED EMBODIMENT

Figure 1:
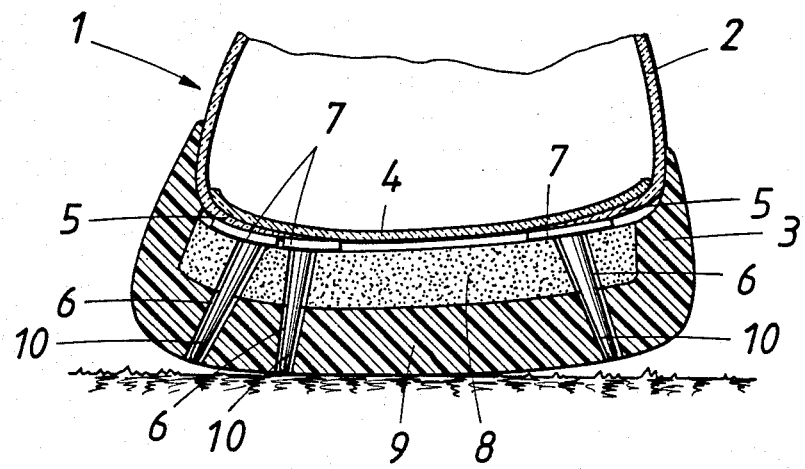
FIG. 1 is a diagrammatic transverse sectional view showing a golf shoe embodying the invention when the sole is subjected to a distributed load.

A preferred embodiment of the invention comprises a golf shoe 1 consisting of an upper 2 and an outsole 3, which are joined at a portion 5 of the upper that has been pulled over the last and is covered by an insole 4. To ensure that the golf shoe 1 will permit a convenient walking and a reliable striking action, the outsole 3 is provided with axially guided spikes 6, each of which comprises a pressure-applying plate 7, which is disposed on top of the outsole 3. The pressure-applying plates 7 bear on the top of a resilient abutment 8, which consists of a sole insert made of soft plastic foam. At least two spikes which are spaced apart transversely to the longitudinal direction of the golf shoe 1. If the load on the sole is distributed over a large area, e.g., during walking, the axially movable spikes 6 will be supported in a retracted position, shown in FIG. 1, by the sole insert 8, which extends between the pressure-applying plates 7 and the tread portion 9 of the outsole 3. As a result, the golf shoe 1 now performs like a spikeless walking shoe. The sole insert 8 and the pressure-applying plates 7 may be shaped to provide a footbed which will comfortably support the foot so that fatigue and pressure points will be avoided.

Figure 2:
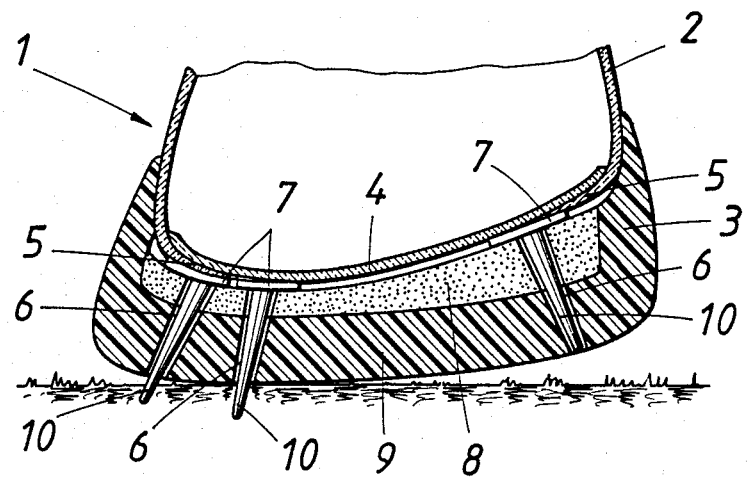
FIG. 2 is a similar view showing the same golf shoe when a unilateral locally concentrated load is applied to the sole.

If a locally concentrated unilateral load is applied to the sole, e.g., as a result of the movement performed by the foot when the golfer is about to strike the golf ball, the sole insert 8 will be compressed by the pressureapplying plates 7 disposed in the region in which the load is concentrated. As a result, the shanks 10 of those spikes which are disposed in that region will project below the tread portion 9 of the outsole 3 and will ensure that the shoe will have the desired firm hold on the ground. It is apparent that the spikes 6 will be effective only when the golfer is about to strike and that they will provide at that time the required hold of the foot in the regions in which the highest load is applied and in which there is the highest risk of slipping (FIG. 2).

The length of the shanks 10 of the spikes 6 has been selected in dependence on the thicknesses of the outsole 3 and of the sole insert 8. It will be apparent that the shanks 10 will be extended and retracted automatically in dependence on the load so that the golf shoe 1 will perform as a walking shoe and as a striking shoe as may be required. The spikes may be combined with any desired tread although the tread will suitably have a profile which matches the spikes. Different spikes may be used in different arrays and the resilient abutment for the spikes may be varied as desired in adaptation to the design of the sole and to the weight of the person who is expected to wear the shoe.

We claim:
1. A golf shoe comprising
   (a) an outsole defining a plurality of through holes,
   (b) an resilient abutment disposed on top of the outsole and covering said through holes, the resilient abutment defining a like plurality of through holes in alignment with the through holes in the outsole,
   (c) a like plurality of spikes, each of which comprises
      (1) a pressure-applying plate bearing on said abutment from above and
      (2) a shank depending from said plate and extending through respective ones of said aligned through holes in the abutment and outsole, and
   (d) an insole disposed on top said abutment, the pressure-applying plates of the spikes being disposed between the abutment and the insole, and the plates conforming to adjacent portions of the insole whereby said spikes are movable between a generally retracted position, in which said spikes do not substantially protrude below said outsole when a golfer is walking in said shoe, and an extended position, in which localized pressure upon respective ones of the adjacent insole portions causes respective ones of the pressure-applying plates to depress the resilient abutment and to move respective ones of the spikes axially through the aligned through holes so that at least certain of said spikes project below said outsole when the golfer performs a swinging motion.

2. The golf shoe set forth in claim 1, wherein each of said shanks has a length corresponding at least to the combined length of the aligned through holes wherethrough the shank extends when the resilient abutment is relaxed.

3. The golf shoe set forth in claim 1, wherein the resilient abutment is an insert in the outsole.

4. The golf shoe set forth in claim 1, wherein the resilient abutment is integral with the outsole.

5. The golf shoe set forth in claim 1, wherein the shanks are detachable connected to the pressure-applying plates of the spikes.

* * * * *